United States Patent
Agata et al.

(10) Patent No.: US 9,946,183 B2
(45) Date of Patent: Apr. 17, 2018

(54) LIQUID DEVELOPER, CIRCUIT BOARD, AND CONDUCTIVE PATTERN FORMING APPARATUS

(71) Applicant: FUJI XEROX CO., LTD., Tokyo (JP)

(72) Inventors: Takeshi Agata, Kanagawa (JP); Hideo Maehata, Kanagawa (JP); Tatsuo Okuno, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/474,882

(22) Filed: Sep. 2, 2014

(65) Prior Publication Data

US 2015/0277258 A1 Oct. 1, 2015

(30) Foreign Application Priority Data

Mar. 25, 2014 (JP) ................. 2014-062105

(51) Int. Cl.
- *G03G 9/12* (2006.01)
- *G03G 9/135* (2006.01)
- *G03G 9/125* (2006.01)
- *G03G 9/13* (2006.01)
- *H05K 3/12* (2006.01)

(52) U.S. Cl.
CPC ........... *G03G 9/122* (2013.01); *G03G 9/12* (2013.01); *G03G 9/125* (2013.01); *G03G 9/13* (2013.01); *G03G 9/135* (2013.01); *H05K 3/1266* (2013.01); *H05K 2203/0143* (2013.01); *H05K 2203/0517* (2013.01); *H05K 2203/0534* (2013.01)

(58) Field of Classification Search
CPC ............................. G03G 9/122; G03G 9/125
USPC .................................. 430/114, 116
See application file for complete search history.

(56) References Cited

U.S. PATENT DOCUMENTS

| | | | | |
|---|---|---|---|---|
| 4,985,321 A * | 1/1991 | Chou | ........................ | G03G 9/12 430/117.4 |
| 5,089,362 A * | 2/1992 | Chou | ........................ | G03G 9/12 430/16 |
| 6,153,348 A * | 11/2000 | Kydd | ................... | G03G 9/0926 430/117.2 |
| 6,376,147 B1 * | 4/2002 | Bonsignore | .............. | G03G 9/13 430/114 |
| 6,979,523 B1 * | 12/2005 | Landa | ....................... | G03G 9/09 430/109.1 |
| 7,560,215 B2 * | 7/2009 | Sharma | ................... | H04L 45/00 430/117.1 |
| 7,670,742 B2 * | 3/2010 | Tsubuko | ................ | C09D 11/36 430/114 |
| 2006/0172219 A1 * | 8/2006 | Stasiak | ................ | G03G 15/221 430/118.6 |
| 2006/0222985 A1 * | 10/2006 | Tsubuko | ................ | C09D 11/36 430/108.1 |
| 2009/0061346 A1 * | 3/2009 | Yamagami | ............. | G03G 15/10 430/114 |
| 2010/0037731 A1 * | 2/2010 | Li | ......................... | B22F 1/0018 75/370 |
| 2010/0248127 A1 * | 9/2010 | Inaba | ....................... | G03G 9/12 430/112 |
| 2011/0217081 A1 * | 9/2011 | Yoshie | ................... | G03G 15/10 399/238 |
| 2013/0224650 A1 * | 8/2013 | Oki | ......................... | G03G 9/122 430/115 |
| 2013/0288176 A1 * | 10/2013 | Ganapathiappan | .... | G03G 9/122 430/112 |
| 2014/0242513 A1 * | 8/2014 | Tatsuura | ................. | G03G 9/12 430/112 |
| 2015/0064424 A1 * | 3/2015 | Negreanu | ............. | C09D 11/037 428/207 |
| 2015/0175826 A1 * | 6/2015 | Mor | ......................... | C09C 3/10 252/512 |
| 2015/0316868 A1 * | 11/2015 | Ganapathiappan | .... | G03G 9/122 430/114 |

FOREIGN PATENT DOCUMENTS

| | | |
|---|---|---|
| JP | H02201481 A | 8/1990 |
| JP | H04199064 A | 7/1992 |
| JP | 2004184598 A | 7/2004 |
| JP | 2006258975 A | 9/2006 |
| JP | A-2008-185980 | 8/2008 |
| JP | A-2008-270398 | 11/2008 |
| JP | 2010169549 A | 8/2010 |
| JP | 5336680 B1 | 11/2013 |
| WO | WO 2006/030286 A1 * | 3/2006 |
| WO | 2012/161098 A1 | 11/2012 |

OTHER PUBLICATIONS

Dec. 5, 2017 Office Action issued in Japanese Application No. 2014-062105.

* cited by examiner

*Primary Examiner* — Christopher D Rodee

(74) *Attorney, Agent, or Firm* — Oliff PLC

(57) ABSTRACT

A liquid developer includes metallic particles that may be surface-treated using an insulating material, and a carrier liquid.

5 Claims, 1 Drawing Sheet

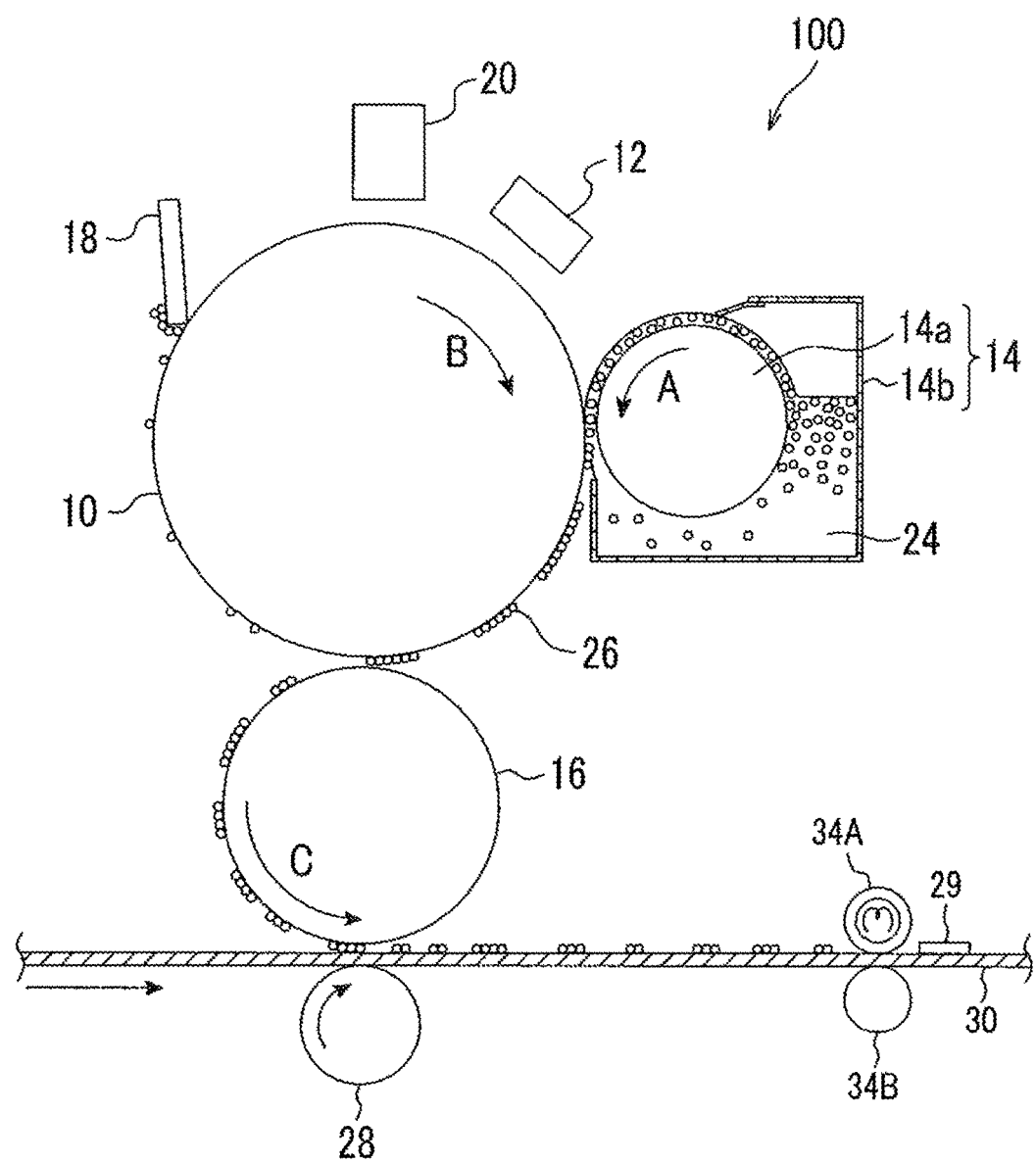

LIQUID DEVELOPER, CIRCUIT BOARD, AND CONDUCTIVE PATTERN FORMING APPARATUS

CROSS-REFERENCE TO RELATED APPLICATIONS

This application is based on and claims priority under 35 USC 119 from Japanese Patent Application No. 2014-062105 filed Mar. 25, 2014.

BACKGROUND

1. Technical Field

The present invention relates to a liquid developer, a circuit board, and a conductive pattern forming apparatus.

2. Related Art

As a technique of preparing an electrical circuit on a resin substrate or the like which is used in the electrical circuit, a photolithographic method, a screen printing method, an offset printing method, or direct drawing or the like by an inkjet method is put to practical use.

Out of these methods, in the photolithographic method and the screen printing method, a mask or a plate is used, and thus a required circuit may not be prepared on demand, and the cost of the mask or the plate is high.

In the inkjet method, direct drawing is possible. However, there are many technical problems, such as preparation of a conductive ink, control of wettability of an ink and a base material, and a lack of resistance to a current due to a wiring formed of a thin film.

SUMMARY

According to an aspect of the invention, there is provided a liquid developer including:

metallic particles that may be surface-treated using an insulating material; and a carrier liquid.

BRIEF DESCRIPTION OF THE DRAWINGS

Exemplary embodiments of the present invention will be described in detail based on the following figure, wherein:

The FIGURE is a schematic configuration diagram illustrating an example of a conductive pattern forming apparatus used in an exemplary embodiment.

DETAILED DESCRIPTION

Hereinafter, a liquid developer and a circuit board according to an embodiment of the invention will be described in detail.

Liquid Developer

A liquid developer according to this exemplary embodiment contains metallic particles which may be surface-treated using an insulating material and a carrier liquid.

A circuit board having a conductive pattern is easily manufactured using the liquid developer according to this exemplary embodiment.

Hereinafter, constituent components of the liquid developer according to this exemplary embodiment will be described in detail.

Metallic Particles

The liquid developer according to this exemplary embodiment contains metallic particles. The metallic particles used in this exemplary embodiment may or may not be surface-treated using an insulating material.

The metal constituting the metallic particles used in this exemplary embodiment is not particularly limited. The metallic particles used in this exemplary embodiment preferably contain at least one type of metal selected from the group consisting of elements belonging to Groups 4 to 13 of the periodic table.

Specific examples of the metal constituting the metallic particles used in this exemplary embodiment include gold, silver, copper, aluminum, platinum, chromium, nickel, tin, and iron. Among these, gold, silver, copper, and aluminum are preferable from the viewpoint of wiring resistance, and gold, silver, and copper are more preferable from the viewpoint of surface stability of the metallic particles. In this exemplary embodiment, these metals may be used singly or in combination of two or more types. When two or more types of metals constitute the metallic particles, these may be used in the form of an alloy or a mixture.

The volume average particle diameter of the metallic particles used in this exemplary embodiment is preferably from 0.001 μm to 5.0 μm, more preferably from 0.001 μm to 2.0 μm, and even more preferably from 0.005 μm to 1.0 μm.

When the metallic particles have a volume average particle diameter in a range of from 0.001 μm to 5.0 μm, the resolution (L/S) of the conductive pattern is improved.

In this exemplary embodiment, the volume average particle diameter of the metallic particles when the metallic particles are surface-treated using an insulating material is a volume average particle diameter of the surface-treated metallic particles.

The volume average particle diameter of the metallic particles is measured using a Microtrack UPA9340 (manufactured by Nikkiso Co., Ltd.).

In the measurement, a measurement sample is added in an amount of from 0.5 mg to 50 mg in 2 ml of a 5% by weight aqueous solution of a surfactant (preferably sodium alkylbenzene sulfonate) as a dispersing agent. The obtained material is added to from 100 ml to 150 ml of distilled water.

The dispersion containing the sample suspended therein is required to be subjected to a dispersion treatment for 1 minute using an ultrasonic dispersing machine.

Regarding the volume, a cumulative distribution is drawn from the small diameter side with respect to particle size ranges (channels) divided on the basis of the measured particle size distribution. A particle diameter at an accumulation of 16% is defined as a volume particle diameter D16v, a particle diameter at an accumulation of 50% is defined as a volume average particle diameter D50v, and a particle diameter at an accumulation of 84% is defined as a volume particle diameter D84v.

Using these, a volume average particle size distribution index (GSDv) is calculated as $(D84v/D16v)^{1/2}$.

In addition, the volume average particle size distribution index GSDv of the metallic particles is preferably 1.5 or less. The volume average particle size distribution index GSDv is more preferably 1.30 or less.

In this exemplary embodiment, GSDv when the metallic particles are surface-treated using an insulating material is GSDv of the surface-treated metallic particles.

In this exemplary embodiment, as the insulating material used in the surface treatment of the metallic particles, any material may be used so long as it is not dissolved in the carrier liquid used in the liquid developer. In this exemplary embodiment, the insulating material is preferably an insulating polymer.

Here, the expression: the insulating material is "not dissolved" in the carrier liquid means that the solubility of the polymeric material is 1% or less even when it swells in the carrier liquid.

Examples of the insulating polymer used in this exemplary embodiment include resins which may be used as a binder resin of a dry electrophotographic toner which has been used hitherto. Specific examples thereof include a polyester resin, an acrylic resin, a methacrylic resin, a styrene-(meth) acrylate copolymer resin, and a polyamide resin. Additional examples of the insulating polymer include a polyurethane resin and a polyurea resin. The insulating materials may be used singly or in combination of two or more types. Among these, a polyester resin, an acrylic resin, and a styrene-(meth) acrylate copolymer are preferable, and a polyester resin and an acrylic resin are more preferable. The (meth) acrylate means acrylate or methacrylate.

When the metallic particles are surface-treated using an insulating material, the amount of the insulating material adhering to the surfaces of the metallic particles is preferably from 0.01 part by weight to 10 parts by weight, and more preferably 0.1 part by weight to 1.0 part by weight with respect to 100 parts by weight of the metallic particles.

Examples of the method of surface-treating the metallic particles using an insulating material include a coating method using a coating layer forming solution in which an insulating material, and if necessary, various types of additives are dissolved in a proper solvent. The solvent is not particularly limited and may be selected in consideration of the insulating material to be used, coatability, and the like.

Specific examples of the surface treatment method include a dipping method of dipping metallic particles in a coating layer forming solution, a spraying method of spraying a coating layer forming solution to surfaces of metallic particles, a fluid bed method of spraying a coating layer forming solution in a state in which metallic particles are allowed to float by flowing air, and a kneader-coater method including: mixing metallic particles and a coating layer forming solution with each other in a kneader-coater; and removing a solvent.

Carrier Liquid

The carrier liquid is an insulating liquid for dispersing the metallic particles, and is not particularly limited. As the carrier liquid used in this exemplary embodiment, alkanes having a boiling point of 50° C. or higher, aromatic hydrocarbons, silicone oils, and the like may be used from the viewpoint of insulating property.

Examples of the carrier liquid include aliphatic hydrocarbon solvents such as paraffin oils (commercially available products thereof include MORESCO WHITE MT-30P, MORESCO WHITE P40 and MORESCO WHITE P70 manufactured by Matsumura Oil Co., Ltd.; Isopar L and Isopar M manufactured by Exxon Mobil Corporation), and hydrocarbon solvents such as naphthene oils (commercially available products thereof include EXOL D80, EXOL D110, and EXOL D130 manufactured by Exxon Mobil Corp.; NAPHTESOL L, NAPHTESOL M, NAPHTESOL H, New NAPHTESOL 160, New NAPHTESOL 200, New NAPHTESOL 220, and New NAPHTESOL MS-20P manufactured by Nippon Petrochemicals Co., Ltd.). The foregoing materials may contain an aromatic compound such as toluene.

One or more types of carrier liquids may be contained in the liquid developer according to this exemplary embodiment. When a mixed system of two or more types is used as the carrier liquid, examples thereof include a mixed system of a paraffin solvent and a vegetable oil and a mixed system of a silicone solvent and a vegetable oil, and a mixed system of a paraffin solvent and a vegetable oil is preferable.

In this exemplary embodiment, the dielectric constant of the carrier liquid is preferably from 1.5 to 2.5, and more preferably from 1.5 to 2.0. When a mixed system of two or more types is used as the carrier liquid, the dielectric constant of the carrier liquid is a dielectric constant of the mixed system.

In this exemplary embodiment, when the metallic particles are surface-treated using an insulating material, as a combination of the insulating material and the carrier liquid, a combination of a polyester resin (insulating material) and an aliphatic hydrocarbon solvent (carrier liquid), a combination of a polyester resin (insulating material) and a silicone oil (carrier liquid), or the like is preferable due to solubility of the insulating material.

The carrier liquid may contain various subsidiary materials such as a dispersing agent, an emulsifier, a surfactant, a stabilizing agent, a wetting agent, a thickener, a foaming agent, an antifoaming agent, a coagulating agent, a gelling agent, an antisetting agent, a charge-controlling agent, an antistatic agent, an antioxidant, a softner, a plasticizer, a filler, an oderant, an antitack agent, and a release agent.

Liquid Developer Manufacturing Method

The liquid developer according to this exemplary embodiment is obtained by mixing the above-described metallic particles and the carrier liquid using a dispersing machine such as a ball mill, a sand mill, an attritor, or a bead mill, and then dispersing the metallic particles in the carrier liquid.

The machine used for the dispersion of the metallic particles in the carrier liquid is not limited to the dispersing machine. The metallic particles may be dispersed by rotating a specific stirring blade as in a mixer, or with ultrasonic waves or a shearing force of a rotor-stator known as a homogenizer.

The concentration of the metallic particles in the carrier liquid is preferably from 0.5% by weight to 40% by weight, and more preferably from 1% by weight to 30% by weight from the viewpoint that the viscosity of the liquid developer is appropriately controlled and the developer is smoothly circulated in a developing machine.

Thereafter, the obtained dispersion may be filtered using, for example, a membrane filter having a pore diameter of 100 μm to remove dust and coarse particles.

Circuit Board

A circuit board according to this exemplary embodiment is a circuit board having: a substrate; and a conductive pattern prepared on the substrate using the liquid developer according to this exemplary embodiment. The circuit board according to this exemplary embodiment may be manufactured using a conductive pattern forming apparatus using the liquid developer according to this exemplary embodiment.

Examples of the substrate used in the manufacturing of the circuit board according to this exemplary embodiment include polyimide resin substrates, polyether sulfone resin substrates, and polyamide resin substrates.

The conductive pattern forming apparatus for manufacturing the circuit board according to this exemplary embodiment is not particularly limited so long as it uses the liquid developer according to this exemplary embodiment as a liquid developer.

As the conductive pattern forming apparatus used in this exemplary embodiment, a conductive pattern forming apparatus having: an electrostatic latent image holding member; a charging device which charges a surface of the electrostatic latent image holding member; a latent image forming device which forms an electrostatic latent image on the surface of the electrostatic latent image holding member; a developing device which stores the liquid developer according to this exemplary embodiment and develops the electrostatic latent image formed on the surface of the electrostatic latent image holding member with the liquid developer to forma conductive pattern image; a transfer device which transfers the conductive pattern image onto a substrate; and a fixing device which fixes the conductive pattern image to the substrate by heating and pressing the conductive pattern image on the substrate is exemplified.

A conductive pattern forming method for manufacturing the circuit board according to this exemplary embodiment is not particularly limited so long as it uses at least the above-described liquid developer according to this exemplary embodiment. For example, a conductive pattern forming method having: a charging process of charging a surface of an electrostatic latent image holding member; a latent image forming process of forming an electrostatic latent image on the surface of the electrostatic latent image holding member; a developing process of developing the electrostatic latent image formed on the surface of the electrostatic latent image holding member with the liquid developer according to this exemplary embodiment to form a conductive pattern image; a transfer process of transferring the conductive pattern image onto a substrate; and a fixing process of fixing the conductive pattern image to the substrate by heating and pressing the conductive pattern image on the substrate.

Hereinafter, configurations of the conductive pattern forming method and the conductive pattern forming apparatus used in this exemplary embodiment will be described in detail using a drawing.

The FIGURE is a schematic configuration diagram illustrating an example of the conductive pattern forming apparatus used in this exemplary embodiment.

A forming apparatus 100 includes a photoreceptor (electrostatic latent image holding member) 10, a charging device 20, an exposure device (latent image forming device) 12, a developing device 14, an intermediate transfer member 16, a cleaner 18, a transfer roller (transfer device) 28, and heating-pressing rolls (fixing device) 34A and 34B.

The photoreceptor 10 has a columnar shape, and the charging device 20, the exposure device 12, the developing device 14, the intermediate transfer member 16, and the cleaner are provided in order at the outer periphery of the photoreceptor 10. The transfer roller 28 is provided at a position where a conductive pattern image 26 transferred onto the intermediate transfer member 16 is transferred onto a substrate 30, and the heating-pressing rolls 34A and 34B are provided in a pair on the downstream side of the transfer roller 28 in a moving direction of the substrate 30.

Hereinafter, an operation of this forming apparatus 100 will be briefly described.

The charging device 20 charges a surface of the photoreceptor 10 to a predetermined potential, and the exposure device 12 exposes the charged surface to, for example, laser beams based on an image signal to form an electrostatic latent image.

The developing device 14 includes a developing roller 14a and a developer storage container 14b. The developing roller 14a is provided so that a part thereof is dipped in a liquid developer 24 stored in the developer storage container 14b. Metallic particles are dispersed in the liquid developer 24, and for example, the liquid developer 24 may be stirred by a stirring member further provided in the developer storage container 14b.

The liquid developer 24 supplied to the developing roller 14a is transported toward the photoreceptor 10 with the rotation of the developing roller 14a in the direction of the arrow A in a state in which the amount thereof is limited to a supply amount determined by a regulation member, and is supplied to the electrostatic latent image in a position where the developing roller 14a faces (or is brought into contact with) the photoreceptor 10. Accordingly, the electrostatic latent image is visualized, and thus the conductive pattern image 26 is obtained.

The developed conductive pattern image 26 is transported to the photoreceptor 10 rotating in the direction of the arrow B of the drawing, and is transferred onto the substrate 30. In this exemplary embodiment, the conductive pattern image is transferred onto the intermediate transfer member 16 before transferring onto the substrate 30. At this time, a difference in circumferential speed may be provided between the photoreceptor 10 and the intermediate transfer member 16.

Next, the conductive pattern image 26 transported in the direction of the arrow C by the intermediate transfer member 16 is transferred onto the substrate 30 in a position where it is in contact with the transfer roller 28.

The heating-pressing rolls 34A and 34B are provided downstream of the transfer roller 28 in the moving direction of the substrate 30. The conductive pattern image is fixed to the substrate 30 by performing heating and pressing with the heating-pressing rolls 34A and 34B.

The heating-pressing rolls 34A and 34B are disposed to be opposed to each other so that a nip is formed with the substrate 30 interposed therebetween. The heating-pressing rolls 34A and 34B are formed to have an elastic rubber layer and a release layer for releasing the conductive pattern image on a metallic roll, and interpose the substrate 30 therebetween by a pressing mechanism (not shown) so as to obtain a fixed pressure and a fixed nip width. In addition, at least one of the heating-pressing rolls 34A and 34B is provided with a heater, and the heater may be provided in both of the heating-pressing rolls 34A and 34B.

The temperature of the heating with the heating-pressing rolls 34A and 34B is preferably from 100° C. to 250° C., and more preferably from 120° C. to 200° C. The pressure to be applied is preferably from 5 kg/cm$^2$ to 50 kg/cm$^2$, and more preferably from 10 kg/cm$^2$ to 30 kg/cm$^2$.

The conductive pattern image is fixed to the substrate 30 in the position of the heating-pressing rolls 34A and 34B, and thus a conductive pattern 29 is formed, and then the substrate 30 is transported up to a discharge unit (not shown).

In the photoreceptor 10 which has transferred the conductive pattern image 26 onto the intermediate transfer member 16, the metallic particles remaining after transferring are conveyed up to a position where these are in contact with the cleaner 18, and are collected by the cleaner 18. When transfer efficiency is near 100% and the presence of metallic particles remaining after transferring is reduced, the cleaner 18 may not be provided.

The forming apparatus 100 may be provided with an erasing device (not shown) which erases the surface of the photoreceptor 10 after transferring and before the next charging.

The charging device 20, the exposure device 12, the developing device 14, the intermediate transfer member 16, the transfer roller 28, the cleaner 18, and the heating-pressing rolls 34A and 34B of the forming apparatus 100 are all operated in synchronization with the rotation speed of the photoreceptor 10.

The conductive pattern forming apparatus illustrated in the FIGURE may have a system in which the liquid developer is supplied to the developer storage container 14b from a liquid developer cartridge (not shown) that is detachable from the conductive pattern forming apparatus.

In the FIGURE, the developing device 14 may have a process cartridge system so as to be detachable from the forming apparatus 100.

In the conductive pattern forming apparatus used in this exemplary embodiment, an electrode roll may be used in place of the photoreceptor (electrostatic latent image holding member). In addition, as the fixing device, a laser light irradiation device which may fix a conductive pattern to a substrate by irradiation of laser light of a wavelength absorbed by the metallic particles may be used in place of the heating-pressing rolls.

EXAMPLES

Hereinafter, this exemplary embodiment will be described in further detail using examples, but the following examples do not limit this exemplary embodiment. Unless otherwise noted, "parts" and "%" are based on the weight below.

Example 1

In this exemplary embodiment, metallic particles may be made using various methods. For example, a chemical synthesis method described in ADVANCED MATERIAL, 2003, vol. 15 (No. 5), pages 396 to 399, and a gas phase synthesis method called a laser ablation method are representative manufacturing methods.

As the metallic nano-particles, a commercially available product may be available and may be used.

The metallic nano-particle liquid developer of this exemplary embodiment may also be made through a solvent substitution method using a commercially available metallic inkjet metallic nano-ink dispersed in a water-soluble solvent.

A method of manufacturing a liquid developer using the metallic nano-particles of this exemplary embodiment will be shown.

1.0 g of silver particles (having a particle diameter of 0.01 μm and a particle size distribution of 1.3 in the particle size distribution measurement) as metallic nano-particles, 100 ml of a silicone oil KF-96 (having a viscosity of 20 cs) manufactured by Shin-Etsu Chemical Co., Ltd. as a dispersion medium, and 0.01 g of Emulgen 130P manufactured by Kao Corporation as a surfactant are mixed and subjected to a dispersion treatment for 5 minutes at 6,500 rpm using a TK homomixer.

As a conductive pattern forming apparatus, an apparatus in which a silicon oxide is deposited as a dielectric film to a material having a comb-shaped pattern formed at L/S of 15 μm with ITO on a glass substrate and an electrode is attached is used to perform developing with a 250 V developing electric field using the liquid developer 1 prepared as described above. After confirmation of the fact that the developed image has been made, a conductive pattern is formed on the substrate through the intermediate transfer member, and thus a circuit board having a desired conductive pattern is obtained.

Example 2

5.0 g of copper particles (having a particle diameter of 0.05 μm and a particle size distribution of 1.3 in the particle size distribution measurement) as metallic nano-particles, a solution obtained by dissolving, in 50 ml of tetrahydrofuran, 0.1 g of a polyester resin which is one of toner resins used in products manufactured by Fuji Xerox Co., Ltd. as an insulating material, and 0.01 g of the same surfactant as in the above description are added, and the copper nano-particles are dipped and stirred for 2 hours using a ceramic ball mill. The obtained dispersion is filtered, and Isopar L, which is used as a developer, is used to wash the copper nano-particles. The obtained polyester-coated metallic nano-particles, 500 ml of Isopar L, and 0.05 g of Emulgen 109P manufactured by Kao Corporation as a surfactant are added and dispersed for 5 minutes at 6,500 rpm using a TK homomixer.

Using the obtained liquid developer 2, a test is performed with the image forming apparatus illustrated in the FIGURE.

Charging and exposure are performed at a charge potential of the photoreceptor of 700 V to develop a comb-shaped circuit pattern at L/S of 20 μm of a conductive pattern made at a developing potential of 250 V.

After confirmation of the fact that the developed image has been made, an electric field of 270 V is given to the intermediate transfer member to perform transfer, and further transferring is performed at 260 V on a PES (polyethersulfone) resin substrate.

The obtained transfer image is fixed using a heating roll (200° C.), and thus it is possible to make a conductive pattern on the base material.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A liquid developer comprising:
   metallic particles;
   an insulating material adhering to the surfaces of the metallic particles, wherein an amount of the insulating material adhering to the surfaces of the metallic particles is from 0.01 parts by weight to 1.0 part by weight of the insulating material with respect to 100 parts by weight of the metallic particles; and
   a carrier liquid that is a mixture of a paraffin solvent and a vegetable oil and that has a dielectric constant of from 1.5 to 2.5,
   wherein the insulating material comprises at least one selected from the group consisting of polyester resin, an acrylic resin, a methacrylic resin, a styrene-(meth)acrylate copolymer resin, a polyamide resin, a polyurethane resin and a polyurea resin,
   wherein a volume average particle size distribution index GSDv of the metallic particles is 1.5 or less, and
   wherein the metallic particles consist of copper.

2. The liquid developer according to claim 1,
   wherein a volume average particle diameter of the metallic particles is from 0.001 μm to 5.0 μm.

3. The liquid developer according to claim 1,
   wherein a concentration of the metallic particles in the carrier liquid is from 0.5% by weight to 40% by weight.

4. The liquid developer according to claim 1,
wherein the volume average particle size distribution index GSDv of the metallic particles is 1.3 or less.

5. A conductive pattern forming apparatus comprising:
an electrostatic latent image holding member;
a charging device that charges a surface of the electrostatic latent image holding member;
a latent image forming device that forms an electrostatic latent image on the surface of the electrostatic latent image holding member;
a developing device that stores the liquid developer according to claim 1 and develops the electrostatic latent image formed on the surface of the electrostatic latent image holding member with the liquid developer to form a conductive pattern image;
a transfer device that transfers the conductive pattern image onto a substrate; and
a fixing device that fixes the conductive pattern image to the substrate by heating and pressing the conductive pattern image on the substrate.

* * * * *